United States Patent
Noh

(10) Patent No.: US 7,830,741 B2
(45) Date of Patent: Nov. 9, 2010

(54) SEMICONDUCTOR MEMORY DEVICE FOR CONTROLLING BANKS

(75) Inventor: Young-Kyu Noh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 12/266,809

(22) Filed: Nov. 7, 2008

(65) Prior Publication Data

US 2009/0323454 A1    Dec. 31, 2009

(30) Foreign Application Priority Data

Jun. 30, 2008    (KR) ..................... 10-2008-0063155

(51) Int. Cl.
*G11C 8/00*    (2006.01)

(52) U.S. Cl. .............. 365/230.06; 365/201; 365/230.08

(58) Field of Classification Search ............ 365/230.03, 365/230.08, 230.06, 201, 191
See application file for complete search history.

(56) References Cited

U.S. PATENT DOCUMENTS

| | | | |
|---|---|---|---|
| 5,771,199 A | | 6/1998 | Lee et al. |
| 5,903,514 A | * | 5/1999 | Sawada .................... 365/233.1 |
| 5,959,930 A | * | 9/1999 | Sakurai ................. 365/230.03 |
| 6,310,816 B2 | | 10/2001 | Manning |
| 6,414,868 B1 | | 7/2002 | Wong et al. |
| 7,154,808 B2 | * | 12/2006 | Shim ..................... 365/230.04 |

FOREIGN PATENT DOCUMENTS

| | | |
|---|---|---|
| JP | 2005-056529 | 3/2005 |
| JP | 2006313622 | 11/2006 |
| KR | 1020070004282 A | 1/2007 |
| KR | 1020070080044 A | 8/2007 |
| KR | 1020080059031 A | 6/2008 |

OTHER PUBLICATIONS

Notice of Preliminary Rejection issued from Korean Intellectual Property Office on Nov. 5, 2009.
Notice of Allowance issued from Korean Intellectual Property Office on Feb. 3, 2010.

* cited by examiner

*Primary Examiner*—Richard Elms
*Assistant Examiner*—Hien N Nguyen
(74) *Attorney, Agent, or Firm*—IP & T Group LLP

(57) ABSTRACT

A semiconductor memory device is capable of easily checking whether banks are overlappingly activated. The semiconductor memory device includes a bank active signal generating unit and an overlap detecting unit. The bank active signal generating unit generates bank active signals for respective different banks in response to an active signal and bank addresses. The overlap detecting unit detects whether the bank active signals of the different banks are overlappingly enabled.

9 Claims, 6 Drawing Sheets

SEMICONDUCTOR MEMORY DEVICE FOR CONTROLLING BANKS

CROSS-REFERENCE TO RELATED APPLICATION

The present invention claims priority of Korean patent application number 10-2008-0063155, filed on Jun. 30, 2008 which is incorporated by reference in its entirety.

BACKGROUND OF THE INVENTION

The present invention relates to a semiconductor memory device, and more particularly to a semiconductor memory device capable of checking whether a plurality of banks are overlappingly operated.

FIG. 1 is a circuit diagram of a bank active signal generating circuit in a conventional semiconductor memory device. Referring to FIG. 1, the bank active signal generating circuit is provided as many as banks of the semiconductor memory device, but only a circuit for generating a bank active signal BANK_ACT<0> of a bank 0. An active signal ACT is enabled when an active command is applied to the semiconductor memory device, without discriminating banks, and a bank address BANK<0> is enabled when a bank 0 is selected.

The bank active signal BANK_ACT<0> of the bank 0 is enabled when the active signal ACT and the bank address BANK<0> are enabled. When the active signal ACT is disabled, the bank active signal BANK_ACT<0> of the bank 0 is disabled. That is, the bank 0 is activated when the external active command is applied and the bank 0 is selected by the address. The banks 1, 2 and 3 are activated in the same manner as the bank 0.

In an active operation of the semiconductor memory device, a normal operation can be achieved when only a bank selected by a bank address is activated. However, several banks may be erroneously activated at the same time due to mismatch of internal timing margins or glitches.

Data error occurs when the banks are overlappingly activated. A constant amount of power to be supplied to one bank is supplied to several banks, leading to degradation of bank performance.

However, since such a problem occurs inside the semiconductor memory device, it is impossible to detect whether the banks are overlappingly activated. That is, it is impossible to intuitively find whether the problem occurs due to the overlap activation of the banks or other factors.

SUMMARY OF THE INVENTION

Embodiments of the present invention are directed to providing a semiconductor memory device capable of easily checking whether banks are overlappingly activated.

In accordance with an aspect of the present invention, there is provided a semiconductor memory device, which includes a bank active signal generating unit configured to generate bank active signals for respective different banks in response to an active signal and bank addresses, and an overlap detecting unit configured to detect whether the bank active signals of the different banks are overlappingly enabled.

Since the overlap detecting unit detects whether the bank active signals are overlappingly enabled, it is possible to determine whether the defects of the semiconductor memory device is caused by the overlap activation of the banks or other factors.

In accordance with another aspect of the present invention, there is provided a semiconductor memory device, which includes a bank active signal generating unit configured to generate bank active signals for respective banks in response to an active signal and bank addresses, an overlap detecting unit configured to detect whether the bank active signals of the different banks are overlappingly enabled, and a bank active control unit configured to control the enabling of the banks according to the detection result of the overlap detection unit.

When the bank active signals are overlappingly enabled, no banks are not activated, so that the read/write operations themselves are not performed. Thus, it is possible to easily detect the defects caused by the overlap enabling of the bank active signals.

In accordance with further aspect of the present invention, there is provided a semiconductor memory device, which includes a bank active signal generating unit configured to generate bank active signals for respective banks in response to an active signal and bank addresses, and a bank active control unit provided at at least one or more banks and configured to control the corresponding bank to be disabled when the other bank active signals are enabled, and the bank active signal of the corresponding bank is enabled.

When activating the banks with the bank active control circuits, the banks are not activated if the bank active signals other than the bank active signal of the corresponding bank are enabled. Therefore, it is possible to easily detect the defects caused by the overlap enabling of the bank active signals.

DESCRIPTION OF SPECIFIC EMBODIMENTS

Hereinafter, a semiconductor memory device in accordance with the present invention will be described in detail with reference to the accompanying drawings.

Figure 1:
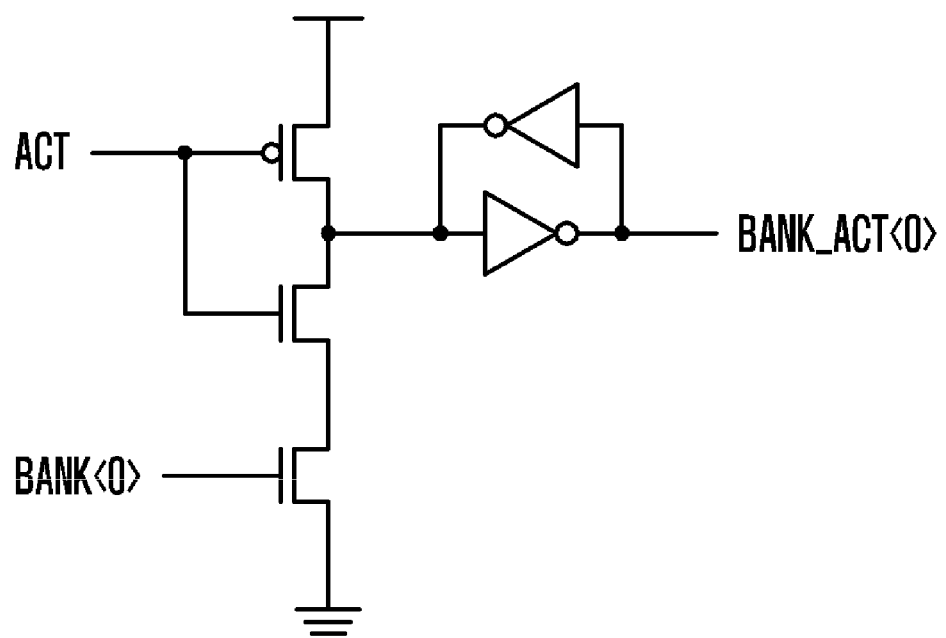
FIG. 1 is a circuit diagram of a bank active signal generating circuit in a conventional semiconductor memory device.
Figure 2:
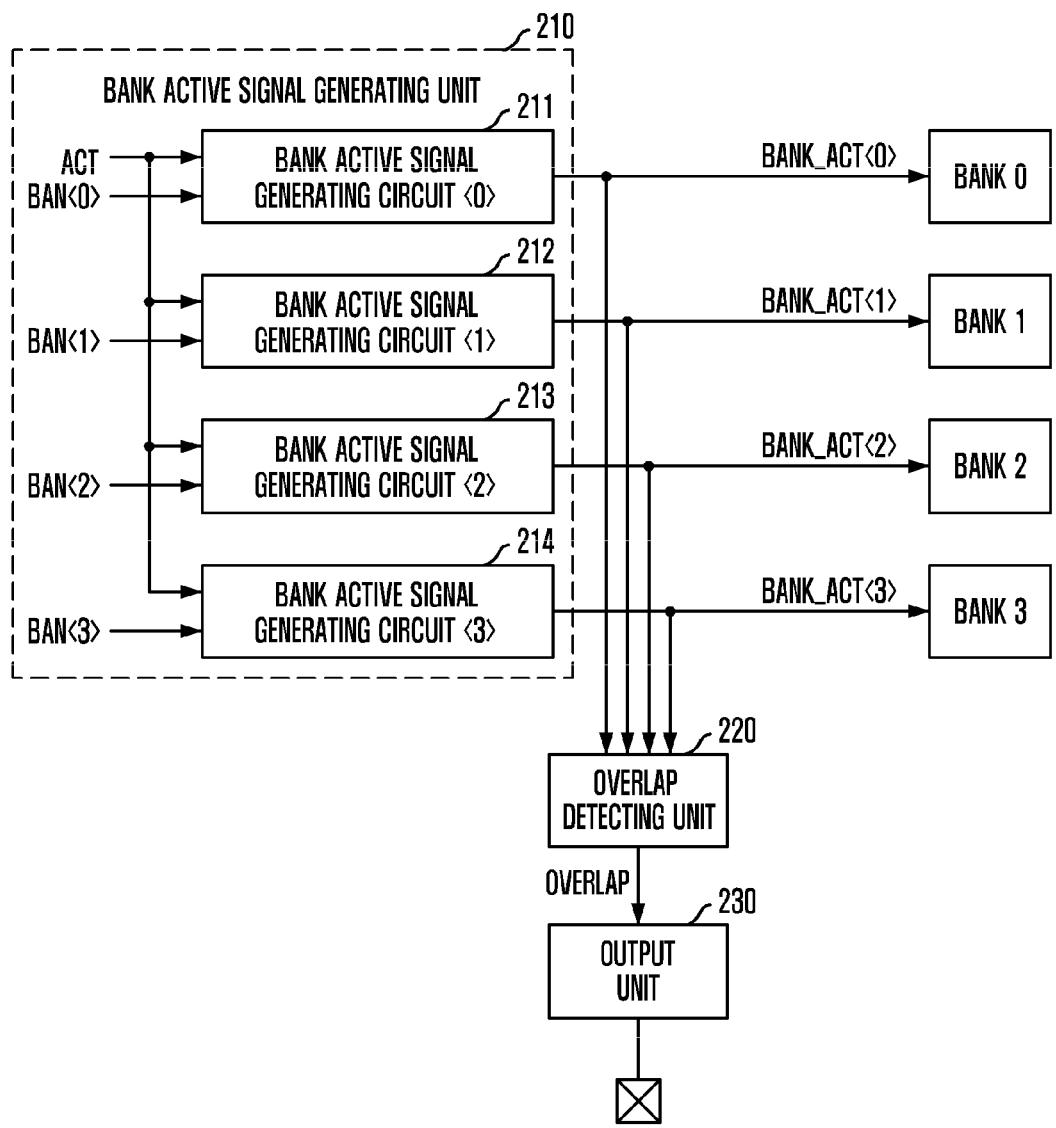
FIG. 2 is a block diagram of a semiconductor memory device in accordance with a first embodiment of the present invention.

FIG. 2 is a block diagram of a semiconductor memory device in accordance with a first embodiment of the present invention. Referring to FIG. 2, the semiconductor memory device in accordance with the first embodiment of the present invention includes a bank active signal generating unit 210, an overlap detecting unit 220, and an output unit 230.

The bank active signal generating unit 210 generates bank active signals BANK_ACT<0:3> in response to an active signal ACT and bank address signals BANK<0:3>. The bank active signal generating unit 210 includes bank active signal generating circuits 211, 212, 213 and 214 provided in the respective banks. Since the bank active signal generating circuits 211, 212, 213 and 214 have been described in the background of the invention, further description thereof will be omitted.

The overlap detecting unit 220 detects whether the bank active signals BANK_ACT<0:3> for the different banks are overlappingly enabled. When one of the bank active signals BANK_ACT<0:3> is enabled, an overlap signal OVERLAP is not enabled. On the other hand, when two or more of the bank active signals BANK_ACT<0:3> are enabled, the overlap signal OVERLAP is enabled to inform that the bank active signals BANK_ACT<0:3> are overlapped enabled.

The output unit 230 outputs the overlap signal OVERLAP to the outside of the semiconductor memory device. The overlap signal OVERLAP may be output through a newly allocated pin. Also, the overlap signal OVERLAP may also be output through a pin that is not used in a test mode. That is, the output unit 230 may be replaced with an output driver that has been used in the semiconductor memory device. The circuit configuration for outputting the overlap signal OVERLAP to the outside of the semiconductor memory device can be easily designed by those of ordinary skill in the art, and thus, further detailed description thereof will be omitted.

The output unit 230 is not an essential element. Even though the overlap signal OVERLAP is not output to the outside of the semiconductor memory device, it is possible to detect whether the overlap signal OVERLAP is enabled or not through a probe test at a wafer level.

Figure 3:
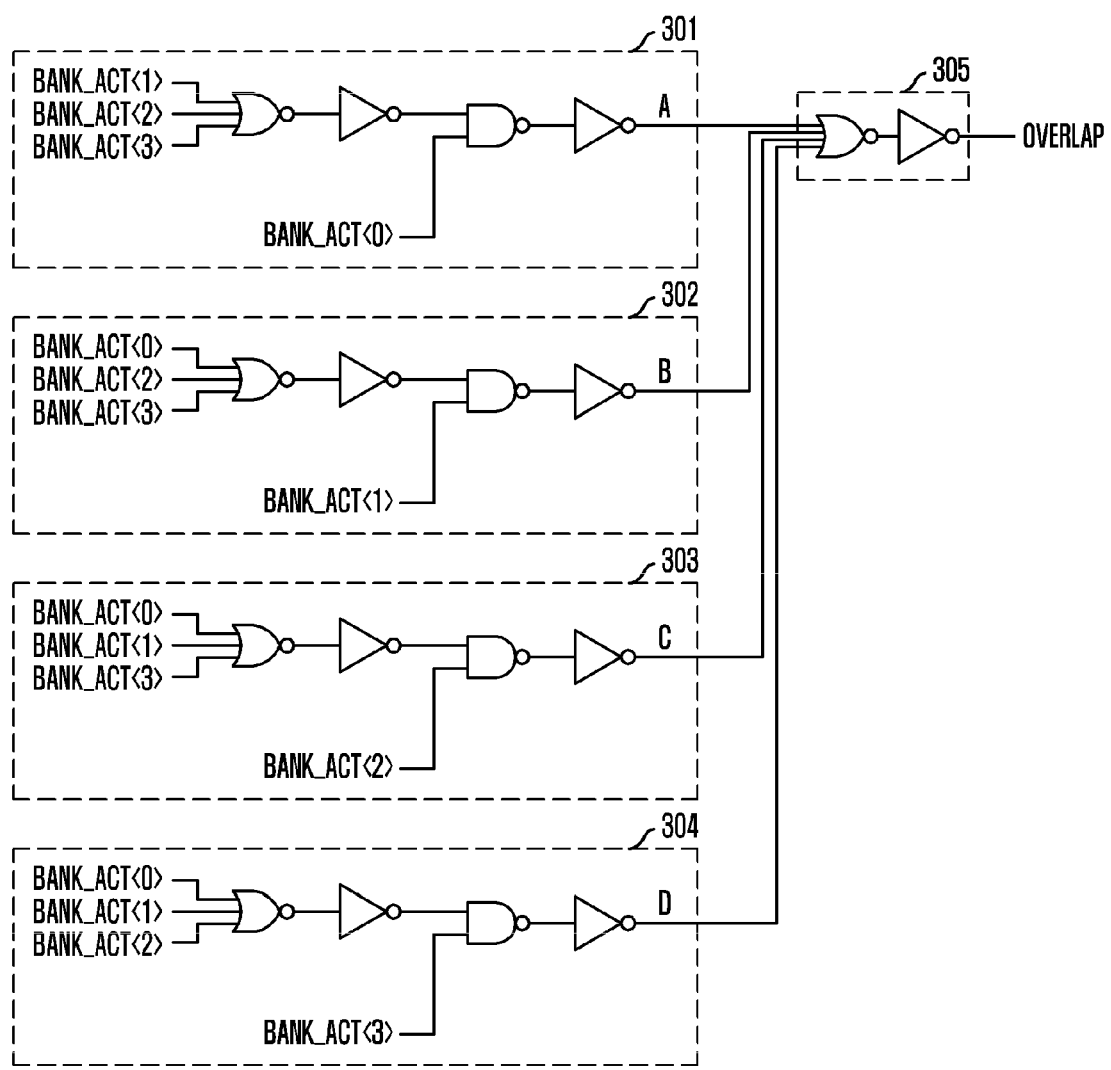
FIG. 3 is a circuit diagram of an overlap detecting unit (230) of FIG. 2.

FIG. 3 is a circuit diagram of the overlap detecting unit of FIG. 2.

Referring to FIG. 3, a circuit configuration 301 checks whether the bank active signal BANK_ACT<0> and the bank active signals BANK_ACT<1>, BANK_ACT<2> and BANK_ACT<3> are overlappingly enabled, and outputs a signal A. A circuit configuration 302 checks whether the bank active signal BANK_ACT<1> and the bank active signals BANK_ACT<0>, BANK_ACT<2> and BANK_ACT<3> are overlappingly enabled, and outputs a signal B.

A circuit configuration 303 checks whether the bank active signal BANK_ACT<2> and the bank active signals BANK_ACT<0>, BANK_ACT<1> and BANK_ACT<3> are overlappingly enabled, and outputs a signal C. A circuit configuration 304 checks whether the bank active signal BANK_ACT<3> and the bank active signals BANK_ACT<0>, BANK_ACT<1> and BANK_ACT<2> are overlappingly enabled, and outputs a signal D.

The circuit configuration 301 will be described in more detail. If any one of the bank active signals BANK_ACT<1>, BANK_ACT<2> and BANK_ACT<3> is enabled in a state that the bank active signal BANK_ACT<0> is enabled to a logic high level, the signal A is enabled to a logic high level. In the other cases, the signal A is disabled to a logic low level. That is, the signal A is enabled when the bank active signal BANK_ACT<0> is enabled and any one of the other bank active signals BANK_ACT<1>, BANK_ACT<2> and BANK_ACT<3> is enabled. The signals B, C and D are generated in the same manner as the signal A.

If any one of the signals A, B, C and D is enabled, an OR gate 305 enables the overlap signal OVERLAP. Accordingly, the enabling of the overlap signal OVERLAP means that at least two or more of the bank active signals are simultaneously activated.

Figure 4:
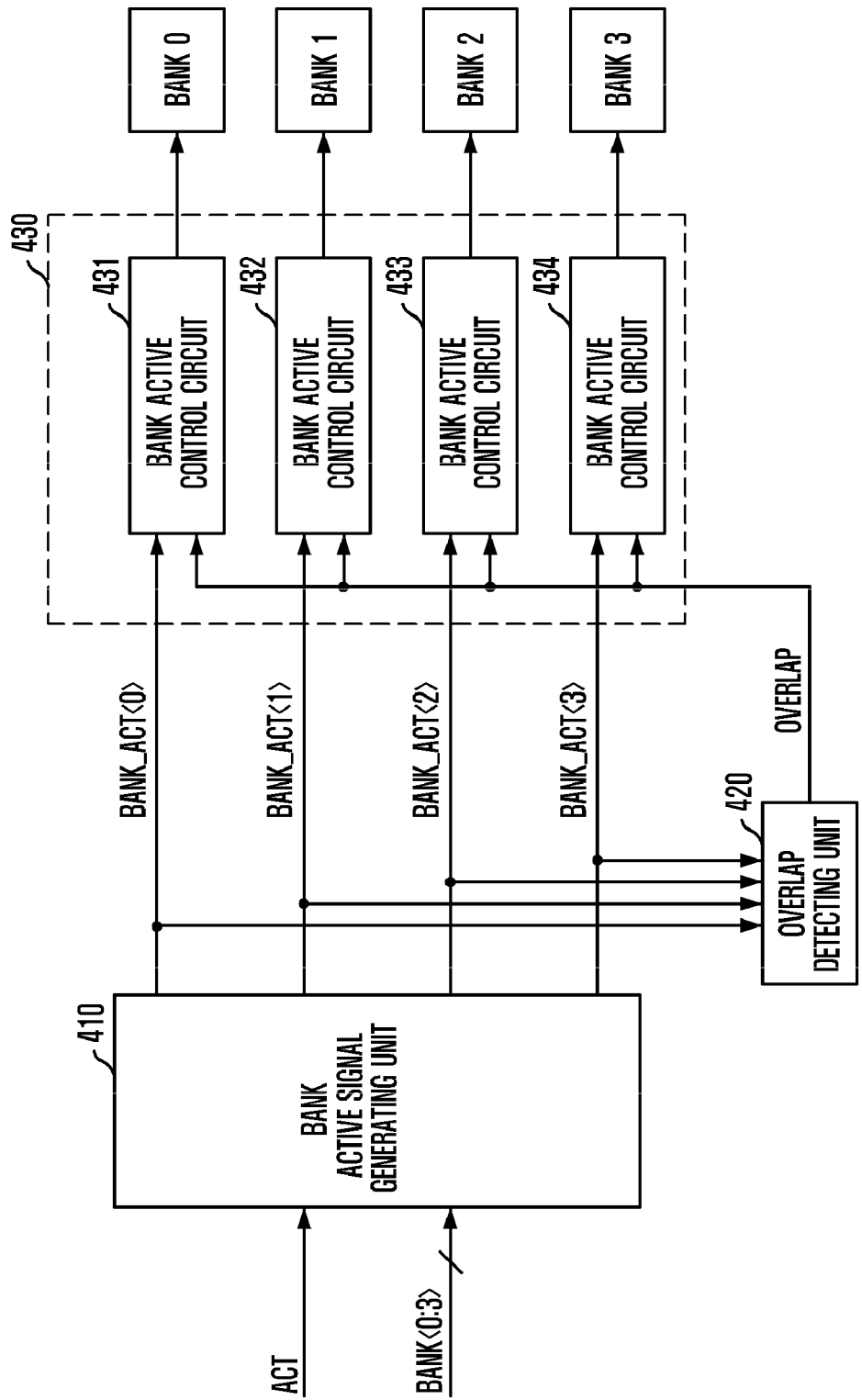
FIG. 4 is a block diagram of a semiconductor memory device in accordance with a second embodiment of the present invention.

FIG. 4 is a block diagram of a semiconductor memory device in accordance with a second embodiment of the present invention. Referring to FIG. 4, the semiconductor memory device in accordance with the second embodiment of the present invention includes a bank active signal generating unit 410, an overlap detecting unit 420, and a bank active control unit 430.

Since the bank active signal generating unit 410 and the overlap detecting unit 420 can be configured with the same structures as those of the first embodiment of the present invention, their detailed description will be omitted.

When the overlap signal OVERLAP is enabled, the bank active control unit 430 prevents the activation of the banks. When no banks are activated, the read/write operations themselves cannot be performed. Thus, the overlap enabling of the bank active signals BANK_ACT<0:3> can be tested by checking that the read/write operations are not performed.

The bank active control unit 430 may include as many bank active control circuits 431, 432, 433 and 434 as the banks. If the overlap signal OVERLAP is enabled, the bank active control circuits 431, 432, 433 and 434 prevent the activation of the banks even though the bank active signals BANK_ACT<0:3> are enabled. The bank active control circuits 431, 432, 433 and 434 may be designed to operate only at a test mode under control of a test mode signal TM.

Figure 5:
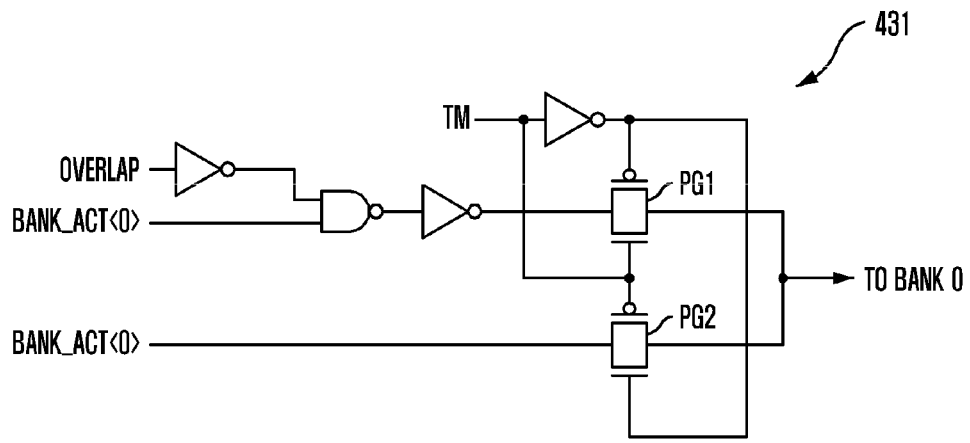
FIG. 5 is a circuit diagram of a bank active control circuit (431) of FIG. 4.

FIG. 5 is a circuit diagram of the bank active control circuit 431 of FIG. 4.

When the test mode signal TM is disabled, a pass gate PG1 is turned off and a pass gate PG2 is turned on. Thus, if the bank active signal BANK_ACT<0> is enabled, the bank 0 is activated. That is, when the test mode signal TM is disabled, the bank active control circuit 431 does not exert its own function.

However, when the test mode signal TM is enabled, the pass gate PG1 is turned on and the pass gate PG2 is turned off. Thus, when the overlap signal OVERLAP is disabled, the bank active signal BANK_ACT<0> is enabled and transferred to the bank 0. When the overlap signal OVERLAP is enabled, only the disabled signal is transferred to the bank 0 even though the bank active signal BANK_ACT<0> is enabled.

That is, when the test mode signal TM is enabled, the bank active control signal 431 prevents the activation of the bank 0 if the overlap signal OVERLAP is enabled. The bank active control circuits 432, 433 and 434 can be configured with the same configuration as the bank active control circuit 431, except the input and output signals.

Figure 6:
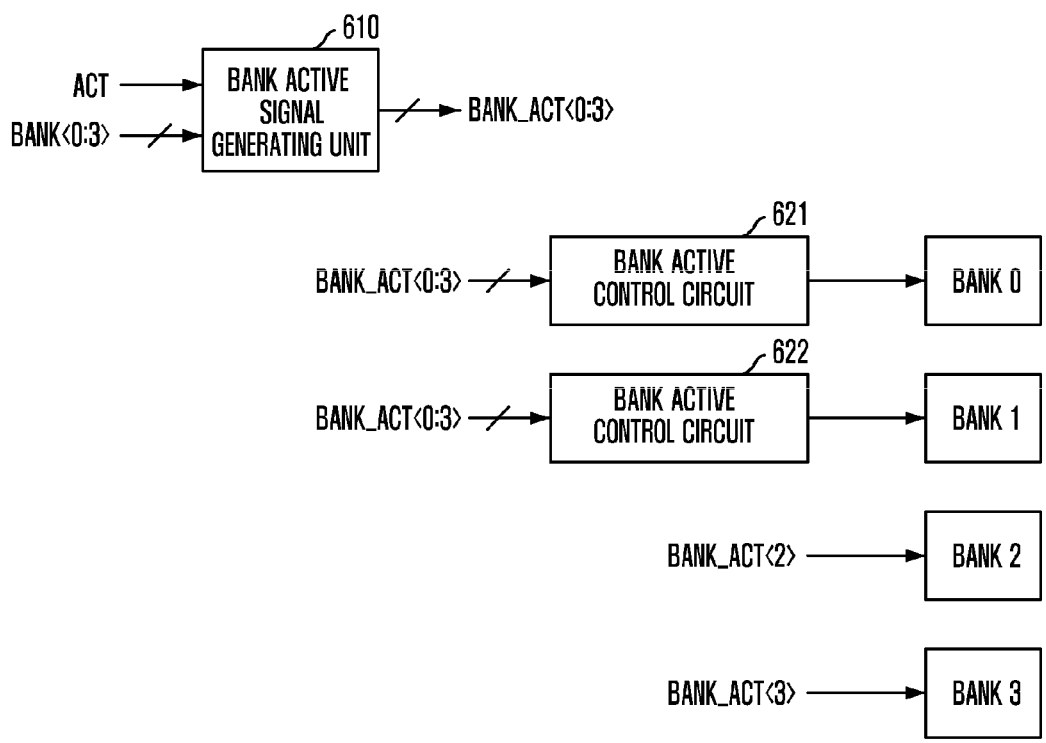
FIG. 6 is a block diagram of a semiconductor memory device in accordance with a third embodiment of the present invention.

FIG. 6 is a block diagram of a semiconductor memory device in accordance with a third embodiment of the present invention. Referring to FIG. 6, the semiconductor memory device in accordance with the third embodiment of the present invention includes a bank active signal generating unit 610 and at least one or more bank active control circuits 621 and 622.

Since the bank active signal generating unit 610 can be designed with the same configuration as the bank active signal generating unit 210 in accordance with the first embodiment of the present invention, further detailed description thereof will be omitted. The bank active control circuits 621 and 622 are provided in respective banks. The bank active control circuits 621 and 622 may be provided in all or some of the banks. Basically, the bank active control circuits 621 and 622 active their banks when corresponding bank active signals BANK_ACT<0> and BANK_ACT<1> are enabled. However, when other banks active signals are enabled, the bank active control circuits 621 and 622 prevent the activation of their banks.

When the bank active signals BANK_ACT<0:3> are overlappingly enabled, the corresponding banks are not activated. Thus, it is possible to check whether the bank active signals BANK_ACT<0:3> are overlappingly enabled.

Although the bank active control circuits 621 and 622 in accordance with the third embodiment of the present invention are somewhat modified, they can be designed to include a partial configuration of the overlap detecting unit 420 and the configuration of the bank active control circuits 431, 432, 433 and 434. A further detailed description will be made below.

Figure 7:
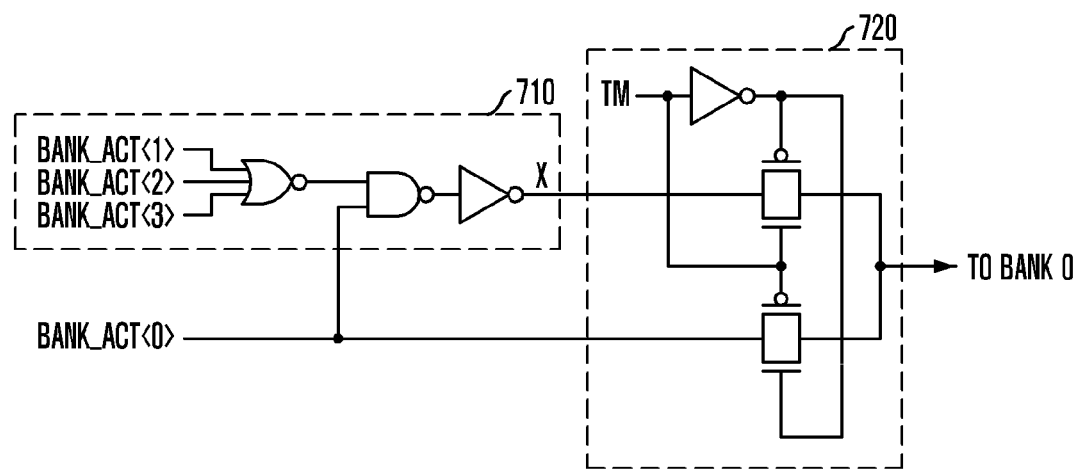
FIG. 7 is a circuit diagram of a bank active control circuit (621) of FIG. 6.

FIG. 7 is a circuit diagram of the bank active control circuit 621 of FIG. 6.

Referring to FIG. 7, the bank active control circuit 621 includes a control signal generating unit 710, and a selecting unit 720. The control signal generating unit 710 generates a control signal X that is enabled in response to the bank active signal BANK_ACT<0> of its own bank, but disabled when the other bank active signals BANK_ACT<1:3> are enabled. The selecting unit 720 selects the control signal X or the bank active signal BANK_ACT<0> in response to the test mode signal TM and outputs the selected signal as a signal for activating the bank.

In a normal operation where the test mode signal TM is disabled, the selecting unit 720 outputs the bank active signal BANK_ACT<0>. Thus, the bank 0 is activated in response to the bank active signal BANK_ACT<0>.

However, when the test mode signal TM is enabled, the selecting unit 720 selects the control signal X and outputs the selected signal as a signal for activating the bank 0. The control signal X is enabled when the bank active signal BANK_ACT<0> is enabled and the other bank active signals BANK_ACT<1:3> are disabled. Thus, the bank 0 performs the active operation only when the bank active signal BANK_ACT<0> for the bank 0 is enabled.

In accordance with the embodiments of the present invention, it is possible to easily determine the occurrence of defects where the banks are overlappingly enabled. Therefore, when problems such as data error or power instability occur, it is possible to easily determine whether the cause is derived from the overlap enabling of the banks or other factors.

While the present invention has been described with respect to the specific embodiments, it will be apparent to those skilled in the art that various changes and modifications may be made without departing from the spirit and scope of the invention as defined in the following claims.

Although it has been described in the above embodiments that the semiconductor memory device includes four banks, the present invention is not limited by a specific number of the banks. For example, the present invention can be applied to various semiconductor memory devices including eight banks or sixteen banks.

What is claimed is:

1. A semiconductor memory device, comprising:
   a bank active signal generating unit configured to generate bank active signals for respective different banks in response to an active signal and bank addresses; and
   an overlap detecting unit configured to detect whether the bank active signals of the different banks are overlappingly enabled.

2. The semiconductor memory device as recited in claim 1, further comprising an output unit configured to output a detection result of the overlap detecting unit to the exterior of the semiconductor memory device.

3. A semiconductor memory device, comprising:
   a bank active signal generating unit configured to generate bank active signals for respective banks in response to an active signal and bank addresses;
   an overlap detecting unit configured to detect whether the bank active signals of the different banks are overlappingly enabled; and
   a bank active control unit configured to control the enabling of the banks according to the detection result of the overlap detection unit.

4. The semiconductor memory device as recited in claim 3, wherein the bank active control unit controls the banks to be disabled when the bank active signals are overlappingly enabled.

5. The semiconductor memory device as recited in claim 4, wherein the bank active control unit is enabled in a test mode.

6. A semiconductor memory device, comprising:
   a bank active signal generating unit configured to generate bank active signals for respective banks in response to an active signal and bank addresses; and
   a bank active control unit provided at at least one or more banks and configured to detect whether the bank active signals of the different banks are overlappingly enabled and to control the enabling of the banks according to the detection result.

7. The semiconductor memory device as recited in claim 6, wherein the bank active control unit is enabled in a test mode.

8. The semiconductor memory device as recited in claim 6, wherein the bank active control unit includes:
   a control signal generating unit configured to generate a control signal that is enabled in response to the bank active signal of the corresponding bank, but disabled when the other bank active signals are enabled; and
   a selecting unit configured to select one of the control signal and the bank active signal of the corresponding bank in response to a test mode signal, and to output the selected signal as a signal for activating the corresponding bank.

9. The semiconductor memory device as recited in claim 6, wherein the bank active control unit controls the corresponding bank to be disabled when the other bank active signals are enabled even if the bank active signal of the corresponding bank is enabled.

* * * * *